(12) United States Patent
Kang

(10) Patent No.: US 6,570,515 B2
(45) Date of Patent: May 27, 2003

(54) DECODER FOR REDUCING TEST TIME FOR DETECTING DEFECTIVE SWITCHES IN A DIGITAL-TO-ANALOG CONVERTER

(75) Inventor: Chang-sig Kang, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/902,377

(22) Filed: Jul. 10, 2001

(65) Prior Publication Data

US 2002/0075176 A1 Jun. 20, 2002

(30) Foreign Application Priority Data

Dec. 18, 2000 (KR) ........................................ 2000-77747

(51) Int. Cl.[7] .............................................. H03M 1/10
(52) U.S. Cl. ........................ 341/120; 341/118; 341/144; 365/154; 365/189.5; 365/201; 365/226; 365/230.6
(58) Field of Search ................................ 341/118, 120, 341/144; 315/201, 154, 189.5, 226, 230.6

(56) References Cited

U.S. PATENT DOCUMENTS 4,449,420 A * 5/1984 Rialan et al. ................ 341/118
5,299,161 A * 3/1994 Choi et al. ................... 365/201
5,841,382 A * 11/1998 Walden et al. ............... 341/120
5,870,043 A * 2/1999 Hiromi ........................ 341/120
6,249,468 B1 * 6/2001 Kan et al. .................... 365/201

* cited by examiner

Primary Examiner—Michael Tokar
Assistant Examiner—Linh Van Nguyen
(74) Attorney, Agent, or Firm—Mills & Onello, LLP

(57) ABSTRACT

A decoder for reducing a test time for detecting defective switches in a digital-to-analog converter includes a switch controlling portion for receiving a plurality of digital input signals having information about analog output signals and at least one test order signal for ordering a normal mode or a test mode, outputting the plurality of digital input signals and inverted signals of the plurality of digital input signals when the test order signal orders the normal mode, and outputting as control signals the plurality of digital input signals and second signals having the same phase as the plurality of digital input signals when the test order signal orders the test mode; a plurality of groups of switches each connected in series to a direct current voltage source; and a switch portion for switching the plurality of direct current voltage sources as a function of the plurality of control signals of the switch controlling portion.

6 Claims, 4 Drawing Sheets

DECODER FOR REDUCING TEST TIME FOR DETECTING DEFECTIVE SWITCHES IN A DIGITAL-TO-ANALOG CONVERTER

BACKGROUND OF THE INVENTION

1. Field of the Invention

The present invention relates to optimization of a test, and more particularly, to a decoder for reducing a test time for detecting defective switches in a digital-to-analog converter.

2. Description of the Related Art

A digital-to-analog converter (DA converter) is a device for converting a discrete digital signal used in contemporary electronic systems to a continuous analog signal which a human can perceive. The DA converter essentially includes a plurality of direct current voltage sources having generally different voltage levels, and a decoder portion having a plurality of switches for switching these voltage sources.

FIG. 1 illustrates a conventional decoder using NMOS transistors as switches.

Referring to FIG. 1, the conventional decoder includes eight direct current voltage sources (VL1 through VL8) having different voltage levels, a plurality of NMOS transistors (MN1 through MN24) which are connected to the eight direct current voltage sources (VL1 through VL8) in series in groups of three and used as switches, three digital signals (D0 through D2) for controlling the plurality of NMOS transistors (MN1 through MN24), and three inverters 11, 12, 13 for inverting the 3 digital signals, respectively.

When the three digital signals (D0 through D2) are all logic high, the three NMOS transistors (MN1 through MN3) turn on, and the direct current voltage source (VL1) is transmitted to an output terminal (VLOUT). When the three digital signals (D0 through D2) are all logic low, three NMOS transistors (MN22 through MN24) turn on, and the direct current voltage source (VL8) is transmitted to the output terminal (VLOUT).

FIG. 2 illustrates a conventional decoder using PMOS transistors as switches. Referring to FIG. 2, the conventional decoder includes eight direct current voltage sources (VH1 through VH8) having different voltage levels, a plurality of PMOS transistors (MP1 through MP24) which are connected to the eight direct current voltage sources (VH1 through VH8) in series in groups of three, and used as switches, three digital signals (D0 through D2) for controlling the plurality of PMOS transistors, and three inverters (21 through 23) for inverting the three digital signals (D0 through D2).

When the three digital signals (D0 through D2) are all logic low, three PMOS transistors (MP1 through MN3) turn on, and the direct current voltage source (VH1) is transmitted to an output terminal (VHOUT). When the three digital signals (D0 through D2) are all logic high, three PMOS transistors (MP22 through MP24) turn on, and the direct current voltage source (VH8) is transmitted to the output terminal (VHOUT).

Referring to FIGS. 1 and 2, one of the eight direct current voltage sources is transmitted to the output terminal (VLOUT) depending on a logic state of the three digital signals (D0 through D2), and a total of three digital signals (D0 through D2) and 24 switches (MN1 through MN24 or MP1 through MP24) are required for selecting and outputting eight analog voltage levels. If there are defects in the switches, the decoder malfunctions.

An NMOS transistor or a PMOS transistor is used as a switch, or a transmission gate combining the NMOS transistor and PMOS transistor is used. The probability of occurrence of a malfunction increases as the number of switches used increases. In order to detect malfunctioning switches, all switches connected to the direct current voltage sources must be tested. A conventional method for testing the switches, in which a switch connected to a direct current voltage source in series is tested one at a time, has many shortcomings in terms of time and economic efficiency.

SUMMARY OF THE INVENTION

To address the above limitations, it is an objective of the present invention to provide a decoder including a test controlling portion which turns on all switches in response to an externally applied test order signal, and detects all defective switches simultaneously by applying a specific pattern.

Accordingly, to achieve the above objective, according to a first preferred embodiment of the present invention, a decoder including a switch controlling portion and a switching portion is provided.

The switch controlling portion receives a plurality of digital input signals having digital information related to an analog output signal and at least one test order signal having data indicating a normal mode of operation or a test mode of operation, outputs as control signals the plurality of digital input signals and inverted signals of the plurality of digital input signals when the test order signal orders a normal mode, and outputs as control signals the plurality of digital input signals and signals having the same phase as the plurality of digital input signals when the test order signal orders a test mode.

The switch portion includes a plurality of switches connected to the same number of direct current voltage source inputs having different voltage levels in series, and switches the plurality of direct current voltage sources as a function of the plurality of control signals of the switch controlling portion.

The switch controlling portion preferably includes a plurality of mode selecting circuits. The plurality of mode selecting circuits output an inverted signal of each of the digital input signals when the test order signal orders a normal mode, and output a signal having the same phase as each of the digital input signals when the test order signal orders a test mode. The plurality of mode selecting circuits include NAND gates, in which one input is connected to one signal of the plurality of digital input signals, and the other input is connected to at least one test order signal. Each of the switches of the switch portion is realized as an NMOS transistor.

To achieve the above objective, according to a second preferred embodiment of the present invention, there is provided a decoder, in which the plurality of switches of the switch portion is realized with PMOS transistors instead of NMOS transistors, and the plurality of mode selecting circuits are replaced with NOR gates having one end connected to one signal of the plurality of digital input signals, and the other end connected to at least one test order signal, instead of NAND gates.

BRIEF DESCRIPTION OF THE DRAWINGS

The above objective(s) and advantages of the present invention will become more apparent by describing in detail a preferred embodiment thereof with reference to the attached drawings in which.

DETAILED DESCRIPTION OF PREFERRED EMBODIMENTS

Figure 1:
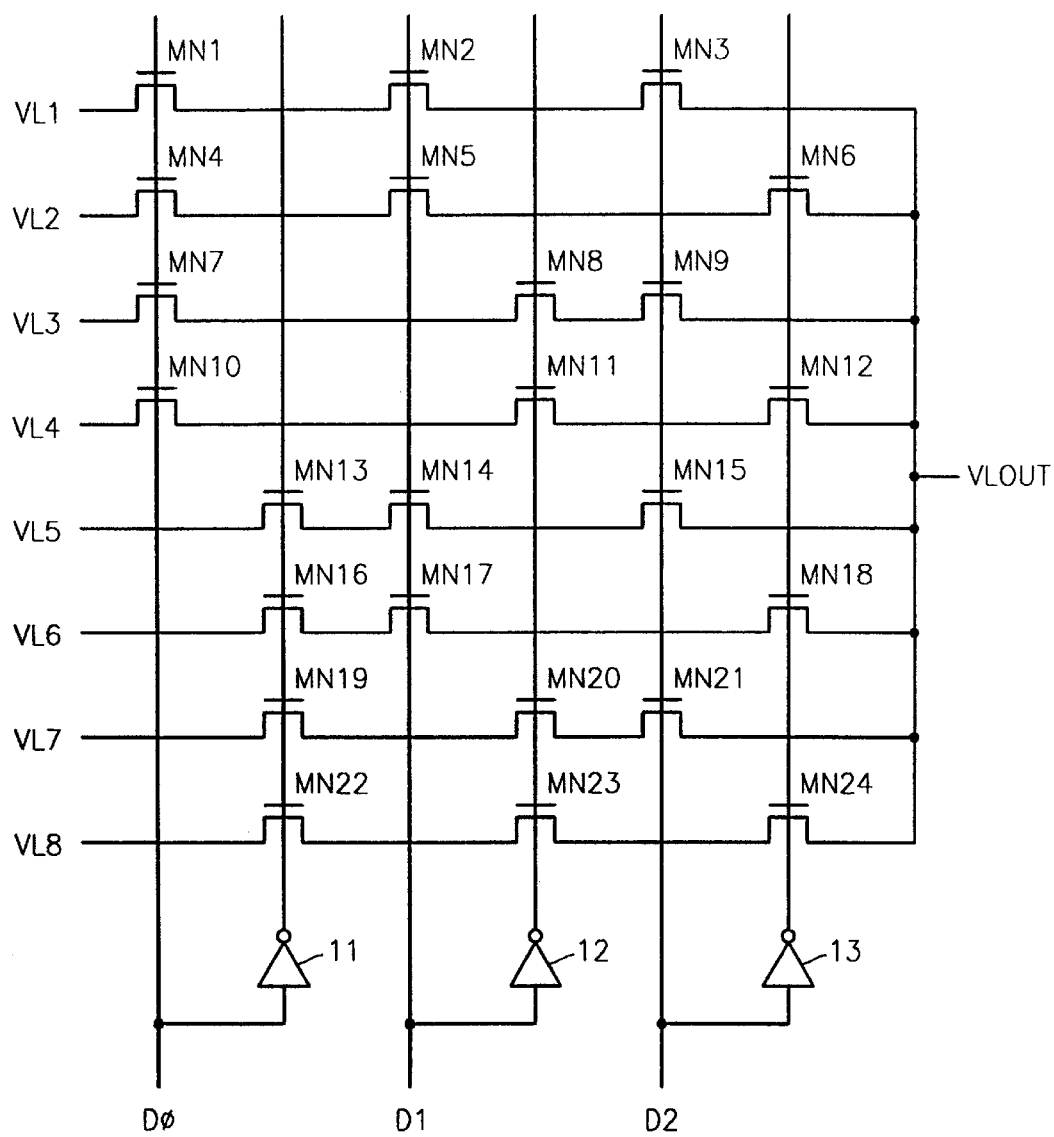
FIG. 1 illustrates a conventional decoder in which the switches are realized as NMOS transistors.
Figure 2:
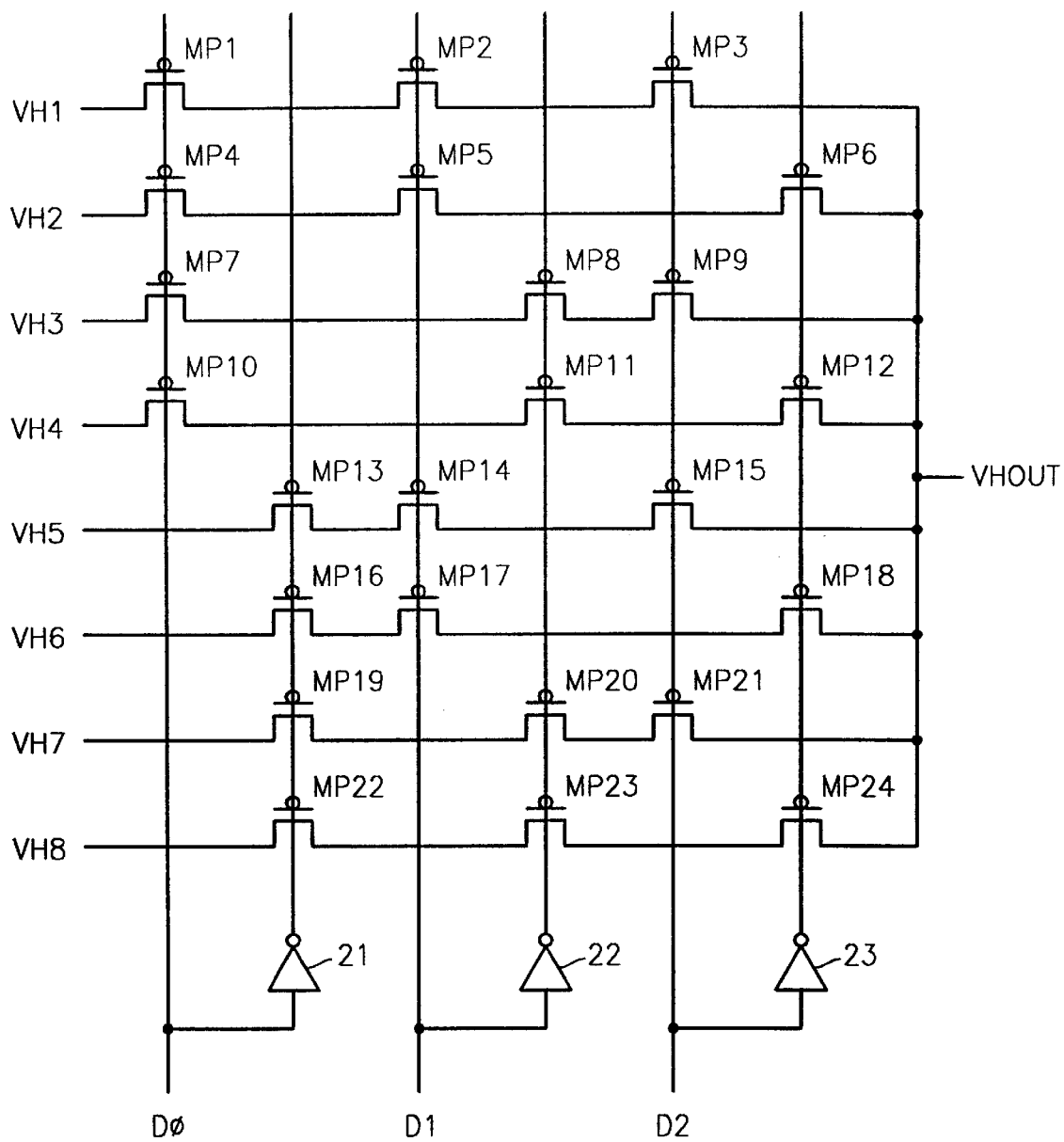
FIG. 2 illustrates a conventional decoder in which the switches are realized as PMOS transistors.

To understand the present invention, the advantages and operation of the present invention, and the objectives achieved by the present invention, the accompanying drawings which illustrate preferred embodiments of the present invention and the description of the accompanying drawings are referred to.

The present invention will now be described more fully with reference to the accompanying drawings, in which preferred embodiments of the invention are shown.

The same reference numerals in different drawings represent the same element, and thus their description will be omitted.

Figure 3:
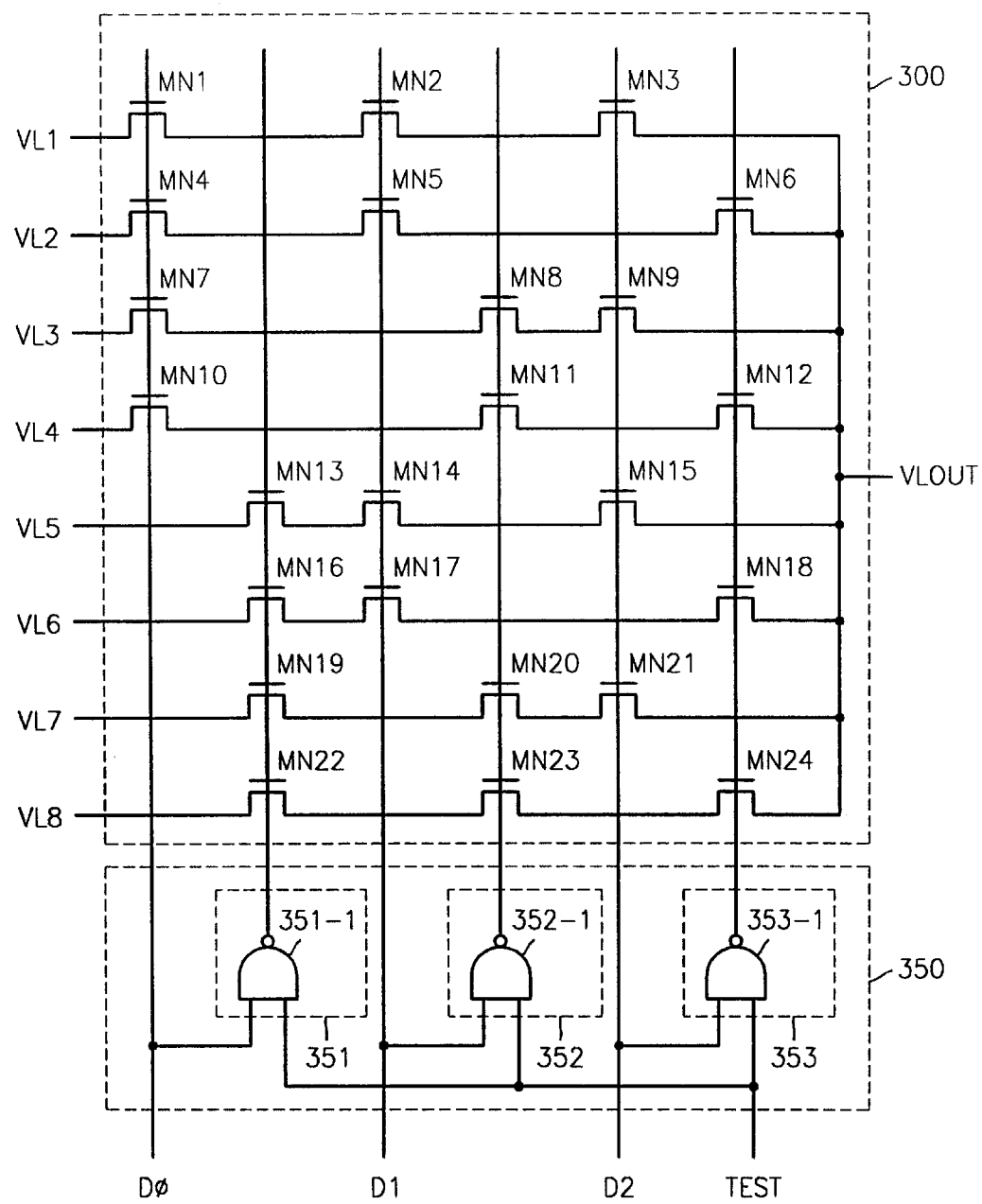
FIG. 3 illustrates a decoder according to a first preferred embodiment of the present invention.

Referring to FIG. 3, a decoder according to a first preferred embodiment of the present invention includes a switch portion 300 and a switch controlling portion 350. The switch controlling portion 350 includes three mode selecting circuits 351 through 353.

The three mode selecting circuits 351 through 353 include NAND gates 351-1, 352-1 and 353-1, respectively. One end of each of the three mode selecting circuits 351 through 353 is connected to an externally applied test order signal (TEST), and the other end is connected to one of three digital signals (D0 through D2) having digital information about an analog output signal, respectively.

The switch portion 300 includes a plurality of NMOS transistors (MN1 through MN 24) used as switches. Direct current voltage sources (VL1 through VL8) having different direct current voltage levels are provided to the switch portion 300, in which groups of three NMOS transistors are connected in series and the final NMOS transistors (MN3, MN6, MN9, MN12, MN15, MN18, MN21, and MN24) are commonly connected to an output terminal (VLOUT).

When the externally applied test order signal (TEST) is logic high, the decoder operates in the normal mode. That is, the NAND gates 351-1 through 353-1 of the mode selecting circuits 351 through 353 invert and output the digital signals (D0 through D2) connected to one input because the test order signal (TEST) connected to the other input is already logic high. For example, when the digital signals (D0 through D2) are all logic high, a voltage value of the first direct current voltage source (VL1) appears in the output terminal (VLOUT). When the digital signals (D0 through D2) are all logic low, a voltage value of the eighth direct current voltage source (VL8) appears in the output terminal (VLOUT).

When the externally applied test order signal (TEST) is logic low, the decoder operates in the test mode. That is, the outputs of the mode selecting circuits 351 through 353 all become logic high regardless of the state of the digital signals (DO through D2). Therefore, when all the digital signals (D0 through D2) become logic high states, all of the NMOS transistors (MN1 through MN24) turn on. In this case, signals of the output terminal (VLOUT) are analyzed by applying a regular direct current voltage to the direct current voltage sources (VL1 through VL8), and it can be determined whether there are defects in the plurality of switches MN1 through MN24.

Figure 4:
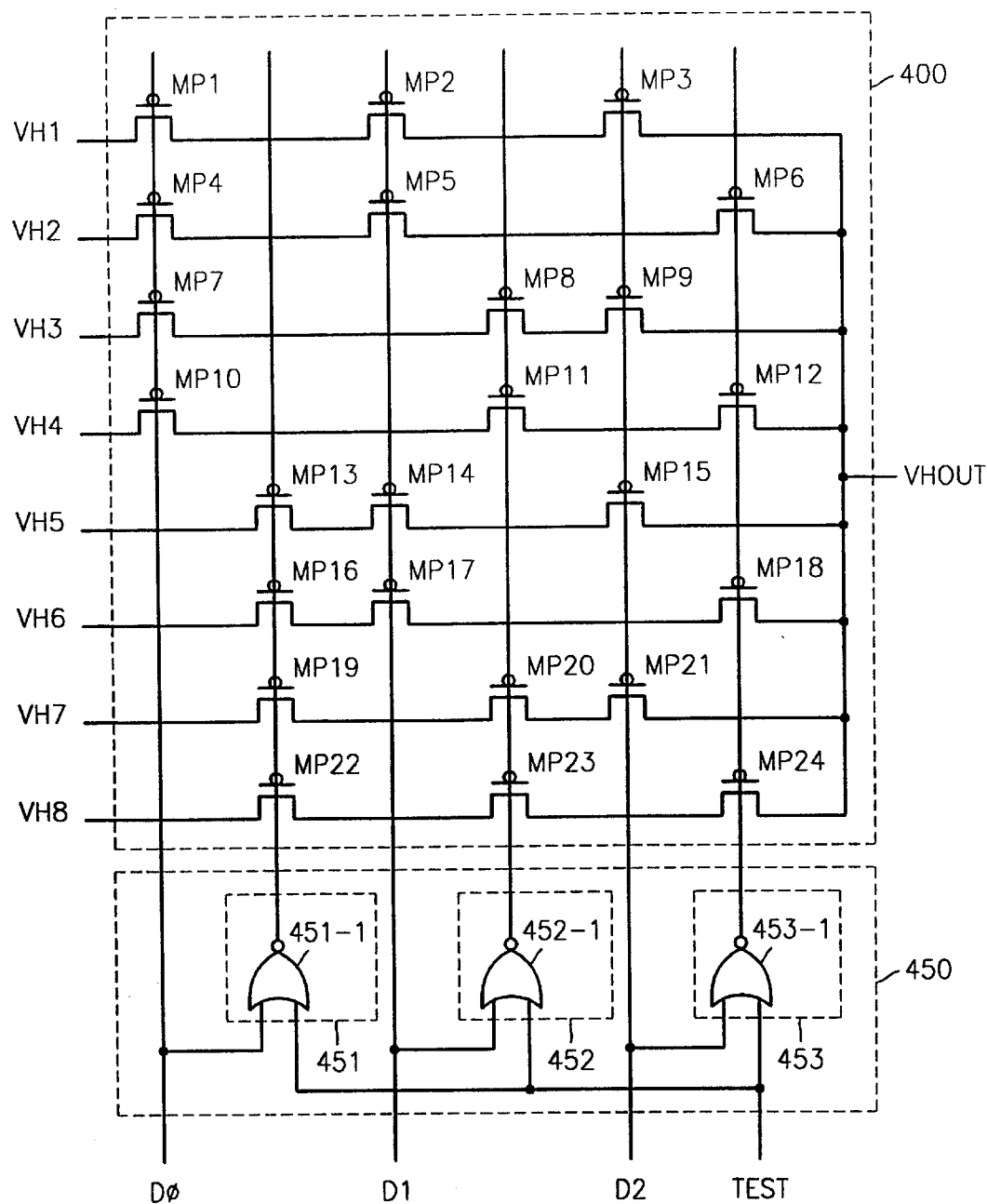
FIG. 4 illustrates a decoder according to a second preferred embodiment of the present invention.

Referring to FIG. 4, a decoder according to a second preferred embodiment of the present invention includes a switch portion 400 and a switch controlling portion 450. The switch controlling portion 450 includes 3 mode selecting circuits 451 through 453.

The three mode selecting circuits 451 through 453 include NOR gates 451-1, 452-1 and 453-1, respectively. One end of each of the three mode selecting circuits 451 through 453 is connected to an externally applied test order signal (TEST), and the other end is connected to one of three digital signals (D0 through D2) having information about an analog signal, respectively.

The switch portion 400 includes a plurality of PMOS transistors (MP1 through MP24) used as switches. The direct current voltage sources (VH1 through VH8) having eight different direct current voltage levels are provided to the switch portion 400, in which groups of three PMOS transistors are connected in series and the final PMOS transistors (MP3, MP6, MP9, MP12, MP15, MP18, MP21, and MP24) are commonly connected to the output terminal (VHOUT).

When the externally applied test order signal (TEST) is logic low, the decoder operates in the normal mode. That is, the mode selecting circuits 451 through 453 invert and output the digital signals (D0 through D2) connected to one input since the test order signal connected to the other input is logic low. For example, when the digital signals (D0 through D2) are all logic low, a voltage value of the first direct current voltage source (VH1) appears at the output terminal (VHOUT). When the digital signals (D0 through D2) are all logic high, a voltage value of the eighth direct current voltage source (VH8) appears in the output terminal (VHOUT).

When the externally applied test order signal (TEST) is logic high, the decoder operates in the test mode. That is, the outputs of the mode selecting circuits 451 through 453 all become logic low regardless of the states of the digital signals (DO through D2). Therefore, if the digital signals (D0 through D2) become all logic low, all of the NMOS transistors (MP1 through MP24) turn on. Here, signals of the output terminal (VHOUT) are analyzed by applying a regular direct current voltage to the direct current voltage sources (VH1 through VH8), and it can be determined whether there are defects in the plurality of switches (MP1 through MP24).

As described above, since the present invention turns on all of the switch transistors using the test order signal (TEST), and analyzes the analog output signals, there is an advantage in that defects of the switch transistors can be detected in one test without the need for a plurality of tests.

While the present invention has been particularly shown and described with reference to preferred embodiments thereof, it will be understood by those skilled in the art that various changes in form and details may be made therein without departing from the spirit and scope of the invention as defined by the appended claims.

What is claimed is:

1. A decoder comprising:

a plurality of direct current voltage source inputs;

a plurality of digital input signals including digital information related to analog output signals;

at least one test order signal having data indicating a normal mode or a test mode;

a switch controlling portion for receiving the plurality of digital input signals and the at least one test order signal, outputting as control signals the plurality of digital input signals and inverted signals of the plurality of digital input signals when the test order signal indicates the normal mode, and outputting as control signals the plurality of digital input signals and second signals having the same phase as the plurality of digital input signals when the test order signal indicates the test mode; and a switching portion including a plurality of groups of switches, each group of switches connected in series between one of the direct current voltage source inputs and a common output node, the switching portion switching direct current voltage signals applied to the plurality of direct current voltage source inputs as a function of the plurality of the control signals of the switch controlling portion, at least one of the groups of switches including a first switch that is activated in response to at least one of the plurality of digital input signals and including a second switch that is activated in response to at least one of the second signals, such that when the test order signal indicates the test mode, the first and second switches in the at least one group are activated in response to the at least one of the plurality of digital input signals and the at least one of the second signals.

2. The decoder of claim 1, wherein the switch controlling portion includes a plurality of mode selecting circuits each for outputting an inverted signal of each of the digital input signals when the test order signal indicates the normal mode, and outputting a signal having the same phase as each of the digital input signals when the test order signal indicates the test mode, each mode selecting circuit coupled to one signal of the plurality of the digital input signals and at least the one test order signal.

3. The decoder of claim 2, wherein each of the mode selecting circuits includes a NAND gate, wherein one input is connected to one signal of the plurality of digital input signals, and the other input is connected to the at least one test order signal.

4. The decoder of claim 2, wherein each of the mode selecting circuits includes a NOR gate, wherein one input is connected to one signal of the plurality of digital input signals, and the other input is connected to the at least one test order signal.

5. The decoder of claim 3, wherein each of the switches is an NMOS transistor.

6. The decoder of claim 4, wherein each of the switches is a PMOS transistor.

* * * * *